United States Patent
Kanitz et al.

(10) Patent No.: US 6,734,622 B1
(45) Date of Patent: May 11, 2004

(54) ORGANIC ELECTROLUMINESCENT COMPONENT FOR AN ORGANIC LIGHT-EMITTING DIODE

(75) Inventors: Andreas Kanitz, Hoechstadt (DE); Matthias Stoessel, Mannheim (DE)

(73) Assignee: Osram Opto Semiconductors GmbH & Co. oHG, Regensburg (DE)

( * ) Notice: Subject to any disclaimer, the term of this patent is extended or adjusted under 35 U.S.C. 154(b) by 0 days.

(21) Appl. No.: 09/937,290

(22) PCT Filed: Mar. 13, 2000

(86) PCT No.: PCT/DE00/00783

§ 371 (c)(1),
(2), (4) Date: Jan. 2, 2002

(87) PCT Pub. No.: WO00/57499

PCT Pub. Date: Sep. 28, 2000

(30) Foreign Application Priority Data

Mar. 24, 1999 (DE) .......................... 199 13 350

(51) Int. Cl.$^7$ ............................................. H05B 33/00
(52) U.S. Cl. ................. 313/504; 313/505; 313/506; 313/503; 313/498; 428/690
(58) Field of Search ................ 313/504–506, 313/498, 503; 428/690; 257/40

(56) References Cited

U.S. PATENT DOCUMENTS

| | | | |
|---|---|---|---|
| 5,677,572 A | 10/1997 | Hung et al. ................. 257/750 |
| 5,739,635 A | * 4/1998 | Wakimoto ................... 313/504 |
| 6,423,429 B2 | * 7/2002 | Kido et al. ................... 428/690 |

FOREIGN PATENT DOCUMENTS

| EP | 0 822 603 | 7/1997 | ........... H01L/51/20 |
|---|---|---|---|
| EP | 0 869 701 | 4/1998 | ........... H05B/33/26 |

OTHER PUBLICATIONS

Tang et al, "Bright high efficiency blue organic light–emitting diodes with $Al_2O_3/Al$ cathodes", *Appl. Phys. Lett.*, vol. 71, No. 18, Nov. 3, 1997, pp. 2560–2562.

Jabbour et al, "Aluminum based cathode structure for enhanced electron injection in electroluminescent organic devices", *Applied Physics Letters*, vol. 73, No. 9, Aug. 31, 1998, pp. 1185–1187.

Gmelins Handbuch der Anorganischen Chemie, System No. 5, published in Germany 1926, pp. 56–72.

* cited by examiner

*Primary Examiner*—Nimeshkumar D. Patel
*Assistant Examiner*—Sikha Roy
(74) *Attorney, Agent, or Firm*—Schiff Hardin LLP

(57) ABSTRACT

The organic electroluminescent component of the invention has a transparent bottom electrode situated on a substrate; a top electrode composed of a metal that is inert to oxygen and moisture; at least one organic function layer arranged between the bottom electrode and the top electrode; and a charge carrier injection layer containing a complex metal salt of the composition $(Me1)(Me2) \ F_{m+n}$, whereby the following applies:

m and n are respectively a whole number corresponding to the valence of the metals Me1 and Me2 (the metal Me1 thereby has the valence m, the metal Me2 the valence n), Me1 is selected from a group consisting of Li, Na, K, Mg and Ca, Me2 is selected from a group consisting of Mg, Al, Ca, Zn, Ag, Sb, Ba, Sm and Yb, with the prescription: Me1≠Me2.

18 Claims, 3 Drawing Sheets

ORGANIC ELECTROLUMINESCENT COMPONENT FOR AN ORGANIC LIGHT-EMITTING DIODE

BACKGROUND OF THE INVENTION

The invention is directed to an organic electroluminescent component, particularly an organic light-emitting diode.

The visualization of data is constantly increasing in significance due to the great increase in the amount of information. The technology of flat picture screens ("flat panel displays") was developed therefor for employment in mobile and portable electronic devices. The market of flat panel displays is currently largely dominated by the technology of liquid crystal displays (LC displays). In addition to cost-beneficial manufacture, low electrical power consumption, low weight and slight space requirement, however, the technology of LC displays also exhibits serious disadvantages.

LC displays are not self-emitting and can therefore only be easily read or recognized given especially beneficial ambient light conditions. This makes a back-illumination device necessary in most instances, but this multiplies the thickness of the flat panel display. Moreover, the majority part of the electrical power consumption of the display is then needed for the illumination, and a higher voltage is required for the operation of the lamps or fluorescent tubes, which higher voltage is usually generated from batteries or accumulators with the assistance of "voltage-up converters". Other disadvantages are the highly limited observation angles of LC displays and the long switching times of individual pixels, which switching times typically lie at a few milliseconds and also are highly temperature-dependent. The delayed image build-up is considered extremely disturbing, for example, given utilization in means of conveyance or given video applications.

There are other flat panel display technologies in addition to LC displays, for example the technology of flat display panel cathode ray tubes, of vacuum-fluorescence displays and of inorganic thin-film electroluminescent displays. However, either these technologies have not yet achieved the required degree of technological maturity or—due to high operating voltages or, respectively, high manufacturing costs—they are only conditionally suited for utilization in portable electronic devices.

Displays on the basis of organic light-emitting diodes, which are called OLEDs, do not exhibit these disadvantages. The necessity of a back-illumination is eliminated due to the self-emissivity, as a result whereof the space requirement and the electrical power consumption are considerably reduced. The switching times lie at about one microsecond and are only slightly temperature-dependent, which enables employment for video applications. The reading angle amounts to nearly 180°, and polarization films that are required given LC displays are eliminated, so that a greater brightness of the display elements can be achieved. Further advantages are the employability of flexible and non-planar substrates as well as a simple and cost-beneficial manufacture.

The construction of organic light-emitting diodes typically ensues in the following way.

A transparent substrate, for example glass, is coated with a transparent electrode (bottom electrode, anode), composed, for example, of indium tin oxide (ITO). Dependent on the application, the transparent electrode is then structured with the assistance of a photolithographic process.

One or more organic layers composed of polymers, oligomers, low-molecular compounds or mixtures thereof are applied on the substrate with the structured electrode. Examples of polymers are polyaniline, poly(p-phenylene-vinylene) and poly(2-methoxy-5-(2'-ethyl)-hexyloxy-p-phenylene-vinylene). Examples of low-molecular compounds that preferably transport positive charge carriers are N,N'-bis-(3-methylphenyl)-N,N'-bis-(phenyl)-benzidine (m-TPD), 4,4',4"-tris-N-3-methylphenyl-N-phenyl-amino)-triphenylamine (m-MTDATA) and 4,4',4"-tris-(carbazole-9-yl)-triphenylamine (TCTA). Hydroxy-chinoline aluminum-III salt ($Alp_3$) that can be doped with suitable chromophores (chinacridone derivatives, aromatic hydrocarbons, etc.), for example, is employed as an emitter. As warranted, additional substances, that influence the electro-optical and the long-term properties, such as copper phthalocyanine, can be present. The application of polymers usually ensues from the liquid phase with doctor blades or spin-coating; low-molecular and oligomeric compounds are usually deposited from the vapor phase by vapor deposition or "physical vapor deposition" (PVD). The overall layer thickness can amount to between 10 nm and 10 μm and it typically lies in the range between 50 and 200 nm.

A cooperating electrode (top electrode, cathode), which is usually composed of a metal, of a metal alloy or of a thin insulator layer and a thick metal layer, is applied onto the organic layer or layers. The manufacture of the cathode layer usually ensues with vapor phase deposition by means of thermal evaporation, electron beam evaporation or sputtering.

When metals are employed as cathode material, then these must have a low work function (typically <3.7 eV) so that electrons can be efficiently injected into the organic semiconductor. Alkaline metals, alkaline earth metals or rare earth metals are usually employed for this purpose and the layer thickness lies between 0.2 nm and a few hundred nanometers but generally at a few 10 nanometers. Since, however, these non-precious metals tend toward corrosion under atmospheric conditions, it is necessary to additionally apply a layer of a more precious, inert metal such as aluminum (Al), copper (Cu), silver (Ag) or gold (Au) onto the cathode layer that protects the non-precious metal layer against moisture and atmospheric oxygen.

For increasing the stability of the cathodes against a corrosion-caused hole formation, an alloy composed of an efficiently electron-injecting but corrosion-susceptible non-precious metal (work function <3.7 eV) and a corrosion-resistant or precious metal, such as Al, Cu, Ag and Au, is often employed instead of an unalloyed non-precious metal. The proportion of the non-precious metal in the alloy can amount to between a few tenths of a percent and approximately 90%. The alloys are usually generated by simultaneous deposition of the metals from the vapor phase, for example by co-vapor deposition, simultaneous sputtering with a plurality of sources and sputtering upon employment of alloy targets. However, a layer of a precious metal or corrosion-resistant metal, such as Al, Cu, Ag or Au, is usually also additionally applied onto such cathodes as protection against corrosion.

Cathodes composed of precious metals, i.e. metals having a work function >3.7 eV, are very inefficient electron injectors when they are utilized in direct contact with the organic semiconductor. When, however, a thin insulating intermediate layer (layer thickness generally between 0.2 and 5 nm) is arranged between the uppermost, electron-conducting organic layer and the metal electrode, then the efficiency of the light-emitting diodes rises substantially. Oxides such as aluminum oxide, alkaline and alkaline earth oxides and other oxides as well as alkaline and alkaline earth fluorides come into consideration as the insulating material for such an intermediate layer (in this respect, see Appl. Phys. Lett., Vol. 71 (1997), pages 2560 through 2562; U.S. Pat. No. 5,677,572; European Published Application 0 822 603). A metal electrode that is composed of a pure metal or of a metal alloy is then applied onto the thin, insulating intermediate layer. The insulating material can thereby also be applied together with the electrode material by means of co-vapor deposition (Appl. Phys. Lett., Vol. 73 (1998), pages 1185 through 1187).

SUMMARY OF THE INVENTION

An object of the invention is to fashion an organic electroluminescent component, particularly an organic light-emitting diode, such that, on the one hand, a hermetic seal of the top electrode can be foregone and, on the other hand, the selection of materials employable at the cathode side is greater.

This is inventively achieved by a component that is characterized by or comprises a transparent bottom electrode situated on a substrate;

a top electrode composed of a metal that is inert to oxygen and moisture;

at least one organic function layer arranged between the bottom electrode and the top electrode; and a charge carrier injection layer containing a complex metal salt of the composition $(Me1)(Me2)F_{m+n}$, whereby the following applies:

m and n are respectively a whole number corresponding to the valence of the metals Me1 and Me2 (the metal Me1 thereby has the valence m, the metal Me2 the valence n), Me1 is selected from a group consisting of Li, Na, K, Mg and Ca.

Me2 is selected from a group consisting of Mg, Al, Ca, Zn, Ag, Sb, Ba, Sm and Yb, with the prescription: Me1≠Me2.

The critical feature of the organic electroluminescent component of the invention is thus in a specific structure at the cathode side, namely in the combination of a top electrode that is indifferent with respect to environmental influences with a charge carrier injection layer composed of a specific complex metal salt having the composition (Me1)(Me2)$F_{m+n}$, i.e. a double fluoride. As a result of this structure, a hermetic seal or, respectively, sealing of the top electrode can be omitted. As a result of the specific material for the charge carrier injection layer, not only is the offering for the materials employable at the cathode side broadened, this material also achieves an improvement of the emission properties, which are expressed in clearly higher light yield, a reduced operating voltage and a longer service life during operation.

The charge carrier injection layer (composed of a specific complex metal salt) is preferably arranged as a thin insulating layer either between the top electrode and the organic function layer or between the uppermost function layer and the top electrode given the presence of a plurality of function layers. When an electron transport layer is also additionally located on the (uppermost) function layer given the component of the invention, then the charge carrier injection layer is arranged between this transport layer and the top electrode. In all of these instances, the thickness of the charge carrier injection layer preferably amounts to approximately 0.1 through 20 nm.

However, the charge carrier injection layer can also be quasi-integrated into the top electrode, into the (uppermost) organic function layer or into an electron transport layer that is potentially present, i.e. the complex metal salt is then a constituent part of one of these layers. The production of such layers can advantageously ensue by means of co-vapor deposition of the corresponding materials, for example by co-vapor deposition of the top electrode material and of the complex metal salt.

The complex metal salt exhibits the composition (Me1)(Me2)$F_{m+n}$, whereby m and n correspond to the valence of the respective metal. m=1 (Li, Na, K) or m=2 (Mg, Ca) is valid for Me1; n=1 (Ag) or n=2 (Mg, Ca, Zn, Ba) or n=3 (Al, Sb, Sm, Yb) is valid for Me2. The metal Me1 is preferably lithium (Li); the metal Me2 is preferably magnesium (Mg), aluminum (Al), calcium (Ca), silver (Ag) or Bariumn (Ba).

Advantageously, one of the double fluorides $LiAgF_2$, $LiBaF_3$ and $LiAlF_4$ is employed as the complex metal salt. More such double fluorides are, for example, $NaAgF_2$, $KAgF_2$, $LiMgF_3$, $LiCaF_3$, $CaAgF_3$ and $MgBaF_4$. Complex salts of this type as well as methods for manufacturing them are known in and of themselves (in this respect, see the exemplary embodiments as well as, for example, "Gmelins Handbuch der Anorganischen Chemie", $8^{th}$ Edition (1926), System Number 5 (fluorine), pages 58 through 72).

The top electrode, which generally comprises a thickness>100 nm, is preferably composed of one of the following metals: aluminum (Al), silver (Ag), platinum (Pt) and gold (Au). The electrode material, however, can also be an alloy of two of these metals. Magnesium (Mg), calcium (Ca), zinc (Zn), antimony (Sb) and barium (Ba) come into consideration as other metals for the top electrode.

The bottom electrode is generally composed of indium tin oxide (ITO). Other possible materials for the bottom electrode are tin oxide and bismuth oxide. Glass generally serves as the substrate for the bottom electrode.

The component of the invention preferably comprises two organic function layers, namely an apertured conducting layer arranged at the bottom electrode that transports positive charge carriers and an emission layer situated thereon that is also referred to as the luminescence layer. Two or more apertured conducting layers can also be advantageously utilized instead of one apertured conducting layer.

The materials for these layers are known in and of themselves. In the present case, N,N'-bis3-methylphenyl)-N,N'-bis(phenyl)-benzidine (m-TPD), 4,4',4"-tris-(N-1-naphthyl-N-phenylamino)-triphenylamine (naphdata) or N,N'-bis-phenyl-N,N'-bis-α-naphthyl-benzidine (α-NPD) is preferably employed for the apertured conducting layer or layers. The material for the emission layer is preferably hydroxychinoline aluminum-III salt ($Alq_3$). Simultaneously, this material can also serve for the electron transport. For example, chinacridone can also be utilized for the emission layer, and one of the oxadiazole derivatives known for this purpose for a potentially present electron transport layer.

The invention offers the following, additional advantages, particularly in view of organic light-emitting diodes:

Facilitated Handling
  Due to the stability of the material of the top electrode, work need not be carried out under an inert gas atmosphere in the manufacture and further-processing of OLEDs.

Performance
  Compared to top electrodes of non-precious metals, the operating voltage is clearly lowered and the light yield and efficiency are considerably enhanced.

Improved Properties

Compared, for example, to LiF as the material for the intermediate layer, compounds such as LiAlF$_4$ have the advantage that they are less hygroscopic, which facilitates the handling and storage. The double fluorides are also easier to evaporate and are less basic than LiF, as a result whereof the compatibility with the organic function layers is increased.

The invention shall be explained in still greater detail on the basis of exemplary embodiments and Figures.

DESCRIPTION OF THE PREFERRED EMBODIMENTS

EXAMPLE 1

Production of Lithium Aluminum Fluoride LiAlF$_4$

Lithium aluminum hydride LiAlH$_4$ is carefully hydrolyzed with distilled water and conversion is subsequently undertaken with hydrofluoric acid (HF) being in excess. The complex metal salt LiAlF$_4$ that thereby precipitates out is extracted, repeatedly washed with water and ethanol and then dried.

EXAMPLE 2

Production of Lithium Silver Fluoride LiAgF$_2$

A solution of stoichiometric quantities of lithium hydroxide and silver acetate is glacial acetic acid is converted with hydrofluoric acid (HF) being in excess upon exclusion of light and the complex metal salt LiAgF$_2$ thereby precipitates out. The complex salt is extracted after the addition of the same volume of ethanol, is washed with ethanol and dried.

EXAMPLE 3

Production of Lithium Barium Fluoride LiBaF$_3$

An aqueous solution of stoichiometric quantities of lithium hydroxide and barium hydroxide is converted with hydrofluoric acid (HF) being in excess. The complex metal salt LiBaF$_3$ precipitates out when chilled (cooling with ice) and it is extracted, repeatedly washed with ethanol and then dried.

The complex metal salt LiCaF$_3$ is produced in a corresponding way, whereby the reaction solution is constricted as warranted.

The complex metal salt LiMgF$_3$ can be produced in the same way and lithium methylate and magnesium methylate are then utilized as the initial substances.

EXAMPLE 4

Figure 1:
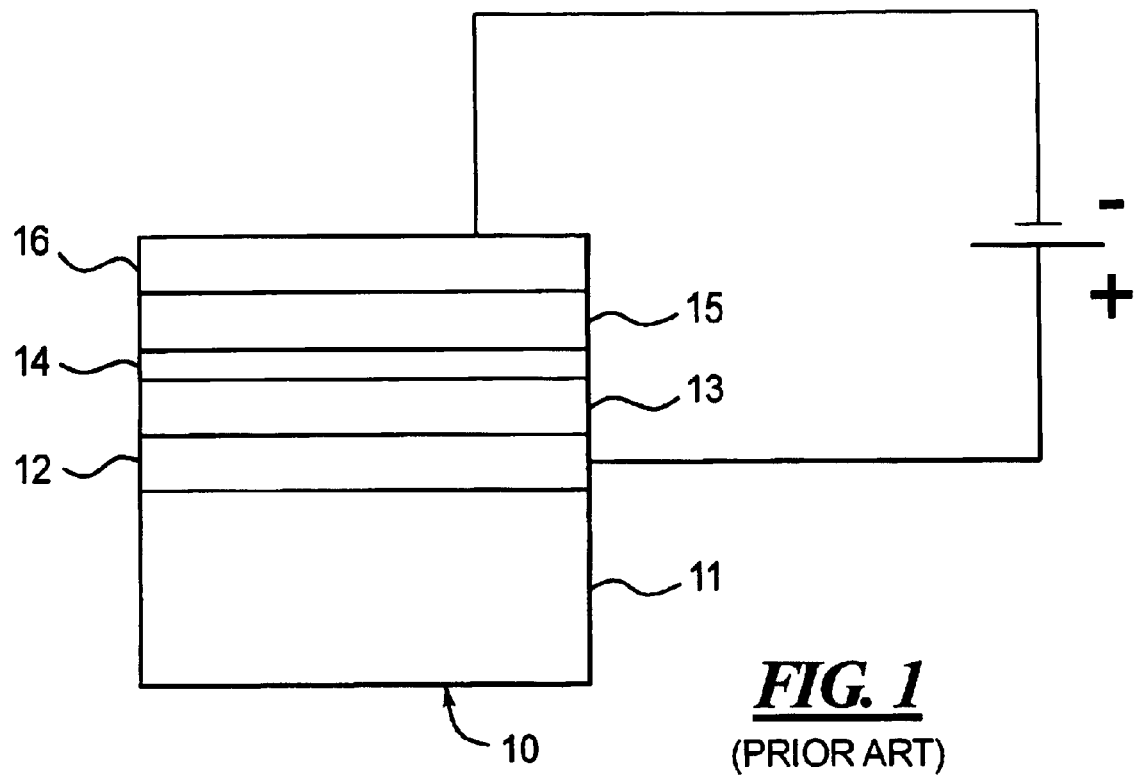
FIG. 1 is a diagrammatic view of a traditional OLED display.

Manufacture of a Traditional OLED Display 10 With a Mg/Ag Cathode (see FIG. 1)

An ITO layer 12 having a thickness of approximately 100 nm is applied onto a glass substrate 11. This layer is then photolithographically structured in such a way that a stripe-shaped structure is produced. A layer 13 of m-TPD having a thickness of approximately 100 nm is first applied by thermal evaporation onto the coated substrate pre-treated in this way, followed by a layer 14 of Alq$_3$ having a thickness of approximately 65 nm.

A layer 15 of a magnesium-silver alloy (Mg:Ag mixing ratio 10:1) having a thickness of approximately 150 nm is applied onto the organic layer 14 by thermal evaporation with two simultaneously operated evaporator sources, and a layer 16 of pure silver having a thickness of approximately 150 nm is applied on the layer 15, likewise by thermal evaporation. The metal layers are thereby vapor-deposited through a mask with stripe-shaped openings, so that cathode stripes that lie perpendicular to the ITO stripes are produced. Organic light-emitting diodes with an active area of 2×2 mm$^2$ respectively are produced in this way at the intersections of the ITO tracks with the metal tracks—together with the organic layers lying therebetween. During operation, the ITO layer is positively contacted and the metal tracks are negatively contacted.

EXAMPLE 5

Figure 2:
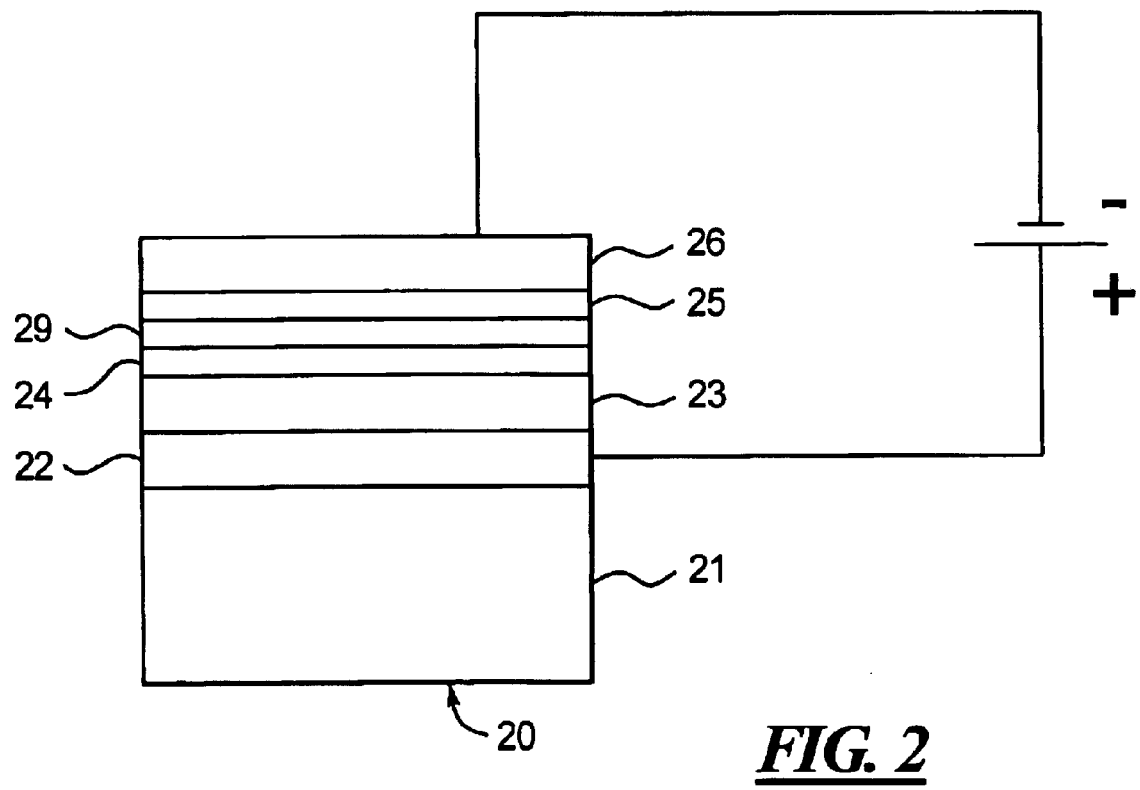
FIG. 2 is a diagrammatic view of an OLED display of the invention.

Manufacture of an OLED Display 20 of the Invention (See FIG. 2)

An ITO layer 22 having a thickness of approximately 100 nm is applied onto a glass substrate 21. This layer is then photolithographically structured in such a way that a stripe-shaped structure is produced. A layer 23 of m-TPD having a thickness of approximately 100 nm is first applied by thermal evaporation onto the coated substrate pre-treated in this way, followed by a layer 24 of Alq$_3$ having a thickness of approximately 65 nm. An electron transport layer 29 is shown on the layer 24; however, the layer 29 may be omitted.

A layer 25 of LiAlF$_4$ having a thickness of approximately 1 nm is applied by thermal evaporation onto the layer 29, if it is present, or, if not present, then onto the layer 24, and a layer 26 of aluminum—serving as a top electrode—having a thickness of approximately 150 nm is applied onto said layer 25, likewise by thermal evaporation. The two layers 25 and 26 are thereby vapor-deposited through a mask with stripe-shaped openings, corresponding to Example 4, so that organic light-emitting diodes are produced. During operation, the ITO layer is positively contacted and the top electrode is negatively contacted.

The results of measurements at the OLEDs corresponding to Examples 4 and 5 are compiled in Table 1. The threshold voltage (of the electroluminescence), the voltage and the efficiency (respectively given a luminance of 1500 cd/m$^2$), the maximum luminance and the luminance given a current density of 50 mA/cm$^2$ are thereby recited as characteristic data.

TABLE 1

| Example | Threshold voltage [V] | Voltage [V] at 1500 cd/m$^3$ | Efficiency [lm/W] at 1500 cd/m$^2$ | Maximum luminance [cd/m$^2$] | Luminance [cd/m$^2$] at 50 mA/cm$^2$ |
|---------|----------------------|------------------------------|------------------------------------|------------------------------|--------------------------------------|
| 4       | 2.08                 | 14.48                        | 0.677                              | 15957                        | 1544                                 |
| 5       | 1.87                 | 14.12                        | 0.720                              | 18801                        | 1605                                 |

It can be seen that the threshold voltage and the operating voltage of the display of the invention (Example 5) lie below the corresponding values given the traditional display (Example 4), even though the thickness of the LiAlF$_4$ was not optimized. The values for the efficiency and the luminances that are achieved given the display of the invention lie above the corresponding values of the traditional display.

Figure 3:
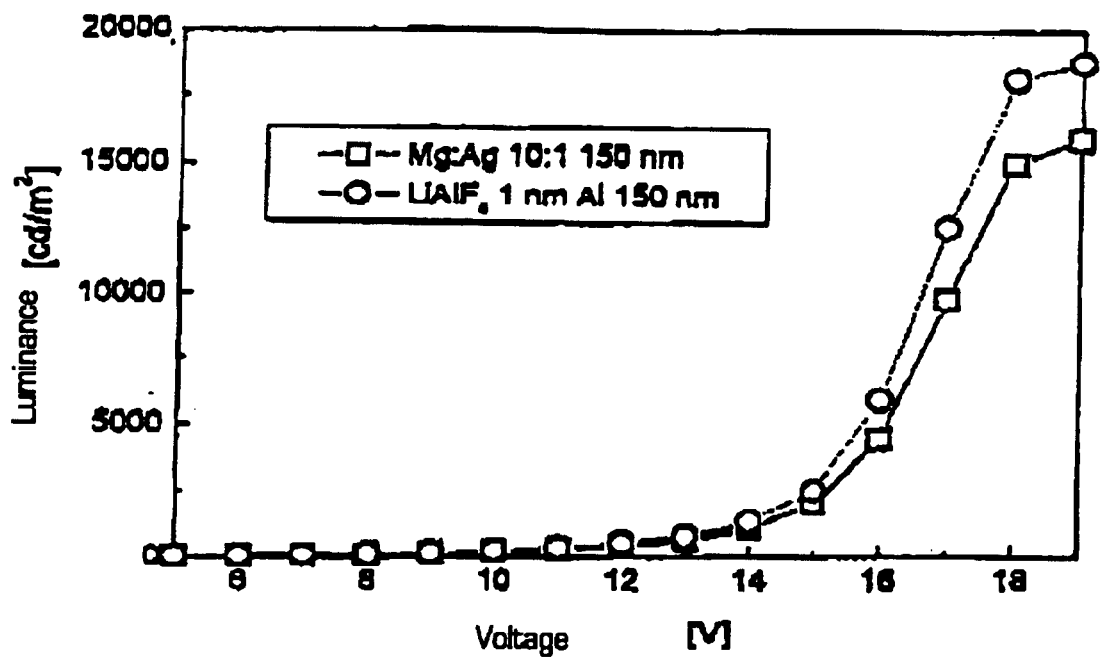
FIG. 3 is a graph showing luminance/voltage characteristics.

FIG. 3 shows the luminance/voltage characteristics of the displays according to Examples 4 and 5. The increased luminance of the display of the invention can be clearly seem from this illustration.

The following can be stated overall:

The display of the invention (Example 5) employs a cathode of aluminum with which efficiencies are normally achieved that lie approximately 40 to 50% below the corresponding values given Mg/Ag cathodes (Example 4). Aluminum, on the other hand, is more stable than magnesium vis a vis environmental influences such as atmospheric oxygen and moisture.

Due to the introduction of a thin $LiAlF_4$ between the organic function layers and the Al cathode, however, the efficiency of OLEDs having an Al cathode can be increased, namely even above the corresponding values of OLEDs with Mg/Ag cathode. In this way, high-efficiency OLEDs with stable cathode can be constructed.

EXAMPLE 6

Manufacture of an OLED Display With a Mg/Ag Cathode

An ITO layer having a thickness of approximately 100 nm is applied onto a glass substrate. This layer is then photolithographically structured in such a way that a stripe-shaped structure is produced. A layer of naphdata having a thickness of approximately 55 nm is first applied by thermal evaporation onto the coated substrate pre-treated in this way, followed by a layer of α-NPD having a thickness of approximately 5 nm, and, finally, a layer of $Alq_3$ having a thickness of approximately 65 nm.

A layer of a magnesium-silver alloy (Mg:Ag mixing ratio 10:1) having a thickness of approximately 150 nm is applied onto the uppermost organic layer (of $Alq_3$) by thermal evaporation with two simultaneously operated evaporator sources, and a layer of pure silver having a thickness of approximately 150 nm is applied on the uppermost organic layer, likewise by thermal evaporation. The metal layers are thereby vapor-deposited through a mask with stripe-shaped openings, so that cathode stripes that lie perpendicular to the ITO stripes are produced. Organic light-emitting diodes with an active area of 2×2 mm² respectively are produced in this way at the intersections of the ITO tracks with the metal tracks—together with the organic layers lying therebetween. During operation, the ITO layer is positively contacted and the metal tracks are negatively contacted.

EXAMPLE 7

Manufacture of an OLED Display With an Al Cathode

Corresponding to Example 6, a display having three organic function layers is constructed. A layer of aluminum having a thickness of 150 nm is then applied in a corresponding way by thermal evaporation onto the uppermost organic layer (of $Alq_3$).

EXAMPLE 8

Manufacture of an OLED Display With an Al Cathode and an LiF Intermediate Layer

A display with three organic function layers is constructed corresponding to Example 6. A layer of LiF having a thickness of approximately 0.5 nm is then applied onto the uppermost organic layer (of $Alq_3$) by thermal evaporation, and a layer of aluminum having a thickness of approximately 150 nm is applied on the uppermost organic layer. The two layers are thereby vapor-deposited through a mask having stripe-shaped openings in conformity with Example 6, so that organic light-emitting diodes are produced. During operation, the ITO layer is positively contacted and the Al cathode is negatively contacted.

EXAMPLE 9

Manufacture of an OLED Display With an Al Cathode and a $LiAlF_4$ Charge Carrier Injection Layer A display with three organic function layers is constructed corresponding to Example 8. A layer of $LiAlF_4$ having a thickness of approximately 0.5 nm is then applied by thermal evaporation onto the uppermost organic layer (of $Alq_3$), and a layer of aluminum—serving as top electrode—having a thickness of approximately 150 nm is applied onto the $LiAlF_4$ layer, likewise by thermal evaporation. The structuring and the contacting ensue in conformity with Example 8.

EXAMPLE 10

Manufacture of an OLED Display With an Al Cathode and a $LiAgF_2$ Charge Carrier Injection Layer A display with three organic function layers is constructed corresponding to Example 6. A layer of $LiAgF_2$ having a thickness of approximately 0.5 nm is then applied by thermal evaporation onto the uppermost organic layer (of $Alq_3$), and a layer of aluminum—serving as a top electrode—having a thickness of approximately 150 nm is applied onto said $LiAlF_4$ layer, likewise by thermal evaporation. The structuring and the contacting ensue in conformity with Example 8.

EXAMPLE 11

Manufacture of an OLED Display With an Al Cathode and a $LiBaF_3$ Charge Carrier Injection Layer A display with three organic function layers is constructed corresponding to Example 6. A layer of $LiBaF_3$ having a thickness of approximately 0.5 nm is then applied by thermal evaporation onto the uppermost organic layer (of $Alq_3$), and a layer of aluminum—serving as a top electrode—having a thickness of approximately 150 nm is applied onto the $LiAlF_4$ layer, likewise by thermal evaporation. The structuring and the contacting ensue in conformity with Example 8.

The results of measurements at the OLEDs corresponding to Examples 6 through 11 are compiled in Table 2. The threshold voltage (of the electroluminescence), the voltage and the efficiency (respectively given a luminance of 1500 cd/m²), the maximum luminance and the luminance given a current density of 50 mA/cm²) are thereby recited as characteristic data.

TABLE 2

| Example | Threshold voltage [V] | Voltage [V] at 1500 cd/m³ | Efficiency [lm/W] at 1500 cd/m² | Luminance [cd/m²] at 50 mA/cm² |
|---|---|---|---|---|
| 6 | 3.19 | 9.96 | 1.08 | 1722 |
| 7 | 7.15 | 16.52 | 0.48 | 1275 |
| 8 | 3.17 | 9.47 | 1.19 | 1809 |

TABLE 2-continued

| Example | Threshold voltage [V] | Voltage [V] at 1500 cd/m³ | Efficiency [lm/W] at 1500 cd/m² | Luminance [cd/m²] at 50 mA/cm² |
|---|---|---|---|---|
| 9 | 4.23 | 11.97 | 0.88 | 1684 |
| 10 | 3.49 | 10.86 | 1.00 | 1745 |
| 11 | 2.56 | 9.58 | 1.26 | 1948 |

It can be seen that the threshold voltages and the operating voltages of the displays of the invention (Examples 9 through 11) that comprise an Al cathode and a charge carrier injection layer composed of a complex metal salt are comparable to the values that are obtained given displays with a Mg/Ag cathode or, respectively, with an Al cathode and a LiF intermediate layer (Examples 6 and 8) and lie clearly below the corresponding values given a display with a pure Al cathode (Example 7). The displays of the invention are also comparable to the Mg/Ag and Al—LiF displays in view of the efficiency and the luminance, whereby a display with a $LiBaF_3$ charge carrier injection layer (Example 11), in particular, exhibits high values.

Figure 4:
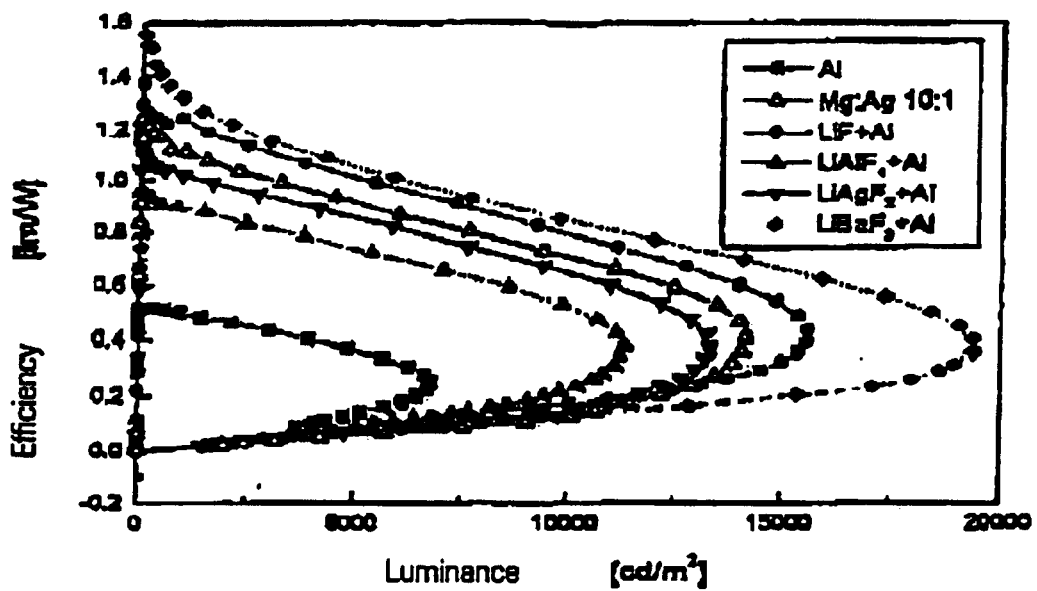
FIG. 4 is a graph showing efficiency/luminance characteristics.

FIG. 4 shows the efficiency/luminance characteristics of the Examples 6 through 11. In particular, the superior position of an Al—$LiBaF_3$ of the invention can be clearly seen from this illustration.

It can be stated overall that the efficiency of LEDs with an Al cathode can be boosted above the corresponding values of OLEDs with a Mg/Ag cathode by introducing thin layers of a complex metal salt such as $LiAlF_4$, $LiAgF_2$ and $LiBaF_3$ between the organic function layers and the cathode. High-efficiency OLEDS with stable contact can be constructed in this way.

Figure 5:
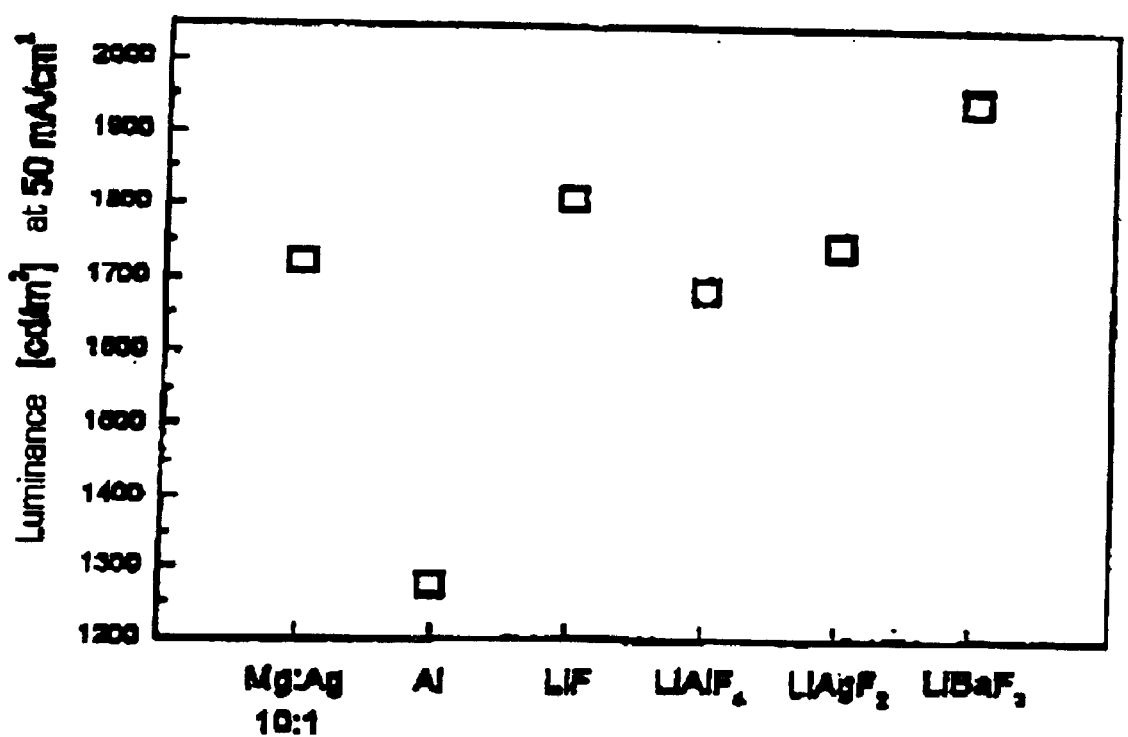
FIG. 5 is a graph showing a comparison of the luminance of various materials.

The values for the luminance (given a current density of 50 mA/cm²) of the materials according to Examples 6 through 11 are compared to one another in FIG. 5. The good results that can be achieved with the displays of the invention also can be derived therefrom.

What is claimed is:

1. An organic electroluminescent component for an organic light-emitting diode, said component comprising:
    a transparent bottom electrode arranged on a substrate;
    a top electrode composed of a metal that is inert to oxygen and moisture;
    at least one organic function layer arranged between the bottom electrode and the top electrode; and
    a charge carrier injection layer containing a complex metal salt which is selected from a group consisting of $LiAgF_2$, $LiBaF_3$, $NaAgF_2$, $KAgF_2$, $LiMgF_3$, $LiCaF_3$, $CaAgF_3$ and $MgBaF_4$.

2. An organic electroluminescent component according to claim 1, wherein the top electrode is composed of a metal selected from a group consisting of aluminum, silver, platinum and gold and of an alloy of two of these metals.

3. An organic electroluminescent component according to claim 2, wherein the charge carrier injection layer is arranged between the top electrode and the uppermost organic function layer.

4. An organic electroluminescent component according to claim 3, wherein the charge carrier injection layer comprises a thickness between 0.1 nm and 20 nm.

5. An organic electroluminescent component according to claim 4, wherein two organic function layers are arranged between the bottom electrode and the top electrode, wherein an apertured conducting layer is located on the bottom electrode and an emission layer is located on said conducting layer.

6. An organic electroluminescent component according to claim 5, wherein the apertured conducting layer contains a material selected from N,N'-bis-(3-methylphenyl)-N,N'-bis (phenyl)-benzidine; 4,4',4"-tris-(N-1-napthyl-N-phenylamino)-triphenylamine; and N,N'-bis-phenyl-N,N'-bis-α-naphthyl-benzidine and the emission layer is a hydroxychinoline aluminum-III salt.

7. An organic electroluminescent component according to claim 6, wherein the bottom electrode is composed of indium tin oxide.

8. An organic electroluminescent component according to claim 7, wherein an electron transport layer is arranged on the at least one organic function layer.

9. An organic electroluminescent component according to claim 1, wherein the charge carrier injection layer is arranged between the top electrode and an uppermost organic function layer.

10. An organic electroluminescent component according to claim 1, wherein the charge carrier injection layer comprises a thickness between 0.1 nm and 20 nm.

11. An organic electroluminescent component according to claim 1, wherein two organic function layers are arranged between the bottom electrode and the top electrode, whereby an apertured conducting layer is located on the bottom electrode and an emission layer is located on said conducting layer.

12. An organic electroluminescent component according to claim 11, wherein the apertured conducting layer is a material selected from N,N'-bis-(3-methylphenyl)-N,N'-bis (phenyl)-benzidine; 4,4',4"-tris-(N-1-naphthyl-N-phenylamino)-triphenylamine and N,N'-bis-phenyl-N,N'-bis-α-naphthyl-benzidine and the emission layer is hydroxychinoline aluminum-III salt.

13. An organic electroluminescent component according to claim 1, wherein the bottom electrode is composed of indium tin oxide.

14. An organic electroluminescent component according to claim 1, wherein an electron transport layer is arranged on the at least one organic function layer.

15. An organic electroluminescent component according to claim 1, wherein the layer containing the complex salt is integrated into one of the top electrode and the uppermost organic function layer.

16. An organic electroluminescent component for an organic light-emitting diode, said component comprising:
    a transparent bottom electrode arranged on a substrate;
    a top electrode composed of a metal that is inert to oxygen and moisture;
    at least one organic function layer arranged between the bottom electrode and the top electrode; and
    a complex metal salt being selected from a group consisting of $LiAgF_2$, $LiBaF_3$, $NaAgF_2$, $KAgF_2$, $LiMgF_3$, $LiCaF_3$, $CaAgF_3$ and $MgBaF_4$, said complex salt being a constituent part of one of the top electrode and the at least one organic function layer.

17. An organic electroluminescent component according to claim 16, wherein the top electrode is composed of a metal selected from a group consisting of aluminum, silver, platinum and gold and of an alloy of two of these metals.

18. An organic electroluminescent component according to claim 16, wherein the bottom electrode is composed of indium tin oxide.

* * * * *